United States Patent
Sun et al.

(10) Patent No.: US 7,466,014 B2
(45) Date of Patent: Dec. 16, 2008

(54) FLIP CHIP MOUNTED SEMICONDUCTOR DEVICE PACKAGE HAVING A DIMPLED LEADFRAME

(76) Inventors: Ming Sun, 927C La Mesa Ter., Sunnyvale, CA (US) 94086; Demei Gong, 2nd Floor, Building 18, 498 Guoshoujing Road, Shanghai Pudong Zhangjiang Software Park, Pudong New Area, Shanghai (CH) 201203

( * ) Notice: Subject to any disclaimer, the term of this patent is extended or adjusted under 35 U.S.C. 154(b) by 0 days.

(21) Appl. No.: 11/786,045

(22) Filed: Apr. 9, 2007

(65) Prior Publication Data

US 2007/0252251 A1   Nov. 1, 2007

(51) Int. Cl.
*H01L 23/495* (2006.01)

(52) U.S. Cl. ........................ 257/673; 257/666; 257/676; 438/108; 438/613

(58) Field of Classification Search ................ 257/666, 257/673, 676; 438/106–127, 612–617
See application file for complete search history.

(56) References Cited

U.S. PATENT DOCUMENTS

2006/0110856 A1 * 5/2006 Kasem et al. ............... 438/123

\* cited by examiner

*Primary Examiner*—George Fourson
*Assistant Examiner*—John M Parker
(74) *Attorney, Agent, or Firm*—Schein & Cai LLP; Douglas E. Mackenzie; Jingming Cai

(57) ABSTRACT

A flip chip mounted semiconductor device package having a dimpled leadframe is disclosed. The semiconductor device package includes a leadframe having a plurality of source dimples and a gate dimple, and a semiconductor die having a plurality of source contact areas and a gate contact area corresponding to the leadframe source dimples and gate dimple respectively, the semiconductor die being flipped onto the leadframe such that cured conductive epoxy provides electrical and mechanical contact between the plurality of source contact areas and the plurality of source dimples, and the gate contact area and the gate dimple.

5 Claims, 5 Drawing Sheets

Wafer Level Lead Frame

Wafer Level Lead Frame

FLIP CHIP MOUNTED SEMICONDUCTOR DEVICE PACKAGE HAVING A DIMPLED LEADFRAME

CROSS REFERENCE TO RELATED APPLICATIONS

This application claims the benefit under 35 U.S.C. 120 of Ser. No. 11/149,954 filed on Jun. 9, 2005.

BACKGROUND OF THE INVENTION

The present invention generally relates to semiconductor device manufacturing methods and more particularly to a wafer level bumpless method of making a flip chip mounted semiconductor device.

Conventional flip chip mounting methods connect a bumped semiconductor die to a land pattern on a substrate. The bumps, which may be formed of solder and gold, are first formed on conductive pads of the semiconductor die. Thereafter, heat and pressure may be applied to the bumps to form the connection paths between the semiconductor die and the substrate. When needed, a flowable material may be introduced into a recess formed between the semiconductor die and the substrate to improve the mechanical connection between the semiconductor die and the substrate.

Conventional flip chip technology has been employed to fabricate low pin count semiconductor devices mounted to lead frames. As disclosed in U.S. Pat. No. 5,817,540, the method generally includes flipping a die onto a lead frame with the use of bumps as interconnects. The wafer may be bumped and sawed beforehand. Upon separating the dies, the bumped dies may be flipped directly onto matching lead frames. Connection between the die and the lead frame is achieved through re-flowing of the solder. When solder bumps are not used as an interconnection, conductive paste or conductive-filled epoxy may be used. After the die is connected to the lead frame, a dielectric layer, or an under-fill material, may be dispensed to cover the gap between the die and the lead frame to prevent shorting and to provide adhesion between the die and lead frame.

Conventional flip chip technology suffers the disadvantage of requiring the costly bumping of the semiconductor die. Furthermore, in the case where the semiconductor die contact pads are formed of aluminum, an under-bump metallization (UBM) layer must be employed to facilitate the user of solder or other bonding materials. Deposition of the UBM layer adds additional cost to the semiconductor package.

There is therefore a need in the art for a wafer level bumpless method of making a flip chip mounted semiconductor device package which overcomes the disadvantages of the prior art. Preferably the wafer level bumpless method reduces the cost of fabricating the flip chip mounted semiconductor device while providing improved reliability of board level packaging. Furthermore, the wafer level bumpless method preferably provides for reductions in the thermal expansion mismatch between the lead frame and a printed circuit board and a larger connection area for board level mounting.

SUMMARY OF THE INVENTION

In accordance with one aspect of the invention, a wafer level bumpless method of making a flip chip mounted semiconductor device includes providing a dimpled leadframe having source and gate dimples which may be attached to a semiconductor device using conductive epoxy to provide both electrical and mechanical connections. The connection may be processed at a wafer level and the wafer thereafter diced into individual die for board level packaging such as surface mounting.

In accordance with another aspect of the invention, a wafer level bumpless method of making flip chip mounted semiconductor device packages includes the steps of solder mask coating a semiconductor die wafer frontside, processing the solder mask coating to reveal a plurality of gate contact and a plurality of source contacts, patterning a lead frame with target dimple areas, creating dimples in the lead frame corresponding to the gate contact and source contacts, printing a conductive epoxy on the lead frame in the dimples, attaching the lead frame to the semiconductor die wafer, curing the lead frame and semiconductor die wafer, and dicing the wafer to form the semiconductor device packages.

In accordance with yet another aspect of the invention, a method of fabricating a semiconductor device package includes the steps of creating a plurality of gate contacts and a plurality of source contacts on a semiconductor die wafer frontside, creating dimples in a lead frame corresponding to the plurality of gate contacts and the plurality of source contacts attaching the lead frame to the semiconductor die wafer, and dicing the semiconductor die wafer to form the semiconductor device packages.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

These and other features, aspects and advantages of the present invention will become better understood with reference to the following drawings, description and claims.

DETAILED DESCRIPTION OF THE INVENTION

Figure 1:
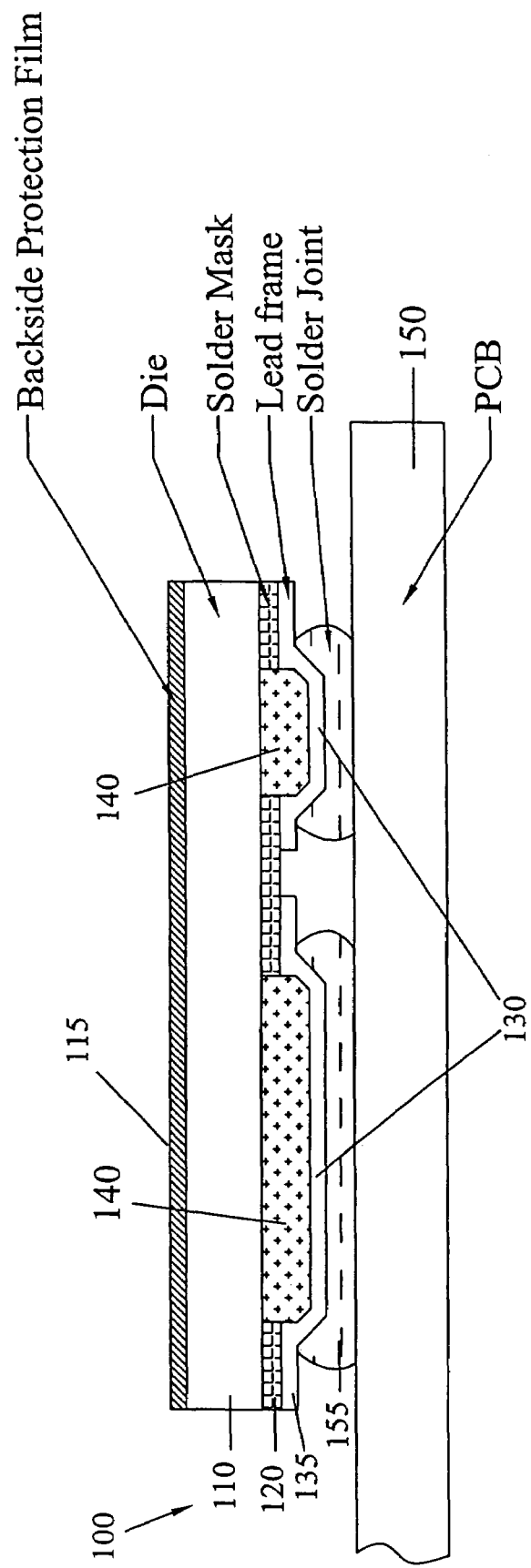
FIG. 1 is a cross sectional view of a semiconductor device package in accordance with the invention.

The present invention generally provides a wafer level bumpless method of making a flip chip mounted semiconductor device package. The method includes providing a dimpled leadframe having source and gate dimples which may be attached to a semiconductor device using conductive epoxy to provide both electrical and mechanical connections. The connection may be processed at a wafer level and the wafer thereafter diced into individual die for board level packaging such as surface mounting With reference to FIG. 1, there is shown a flip chip mounted semiconductor device package generally designated 100 in accordance with the invention. Semiconductor device package 100 results from the process of the invention which is performed at the wafer level. A semiconductor die 110 may include a protective epoxy layer 115 printed and cured on a drain backside by conventional methods. A solder mask 120 may be coated and exposed or stripped on a gate/source frontside of the semiconductor die 110 by conventional methods to expose gate and source contact pads (not shown). Dimples 130 may be formed in a lead frame 135 by stamping the lead frame 135 prior to connecting the lead frame 135 to the semiconductor die 110 to provide dimples 130 aligned with the gate and source contact pads.

Epoxy 140 may be printed on the lead frame 135 to provide electrical and mechanical connection between the semiconductor die 110 and the lead frame 135. The semiconductor die 110 may be attached to the lead frame 135 and cured. Following wafer dicing, the semiconductor die 110 may be soldered to a printed circuit board 150 by means of solder joints 155.

Figure 2:
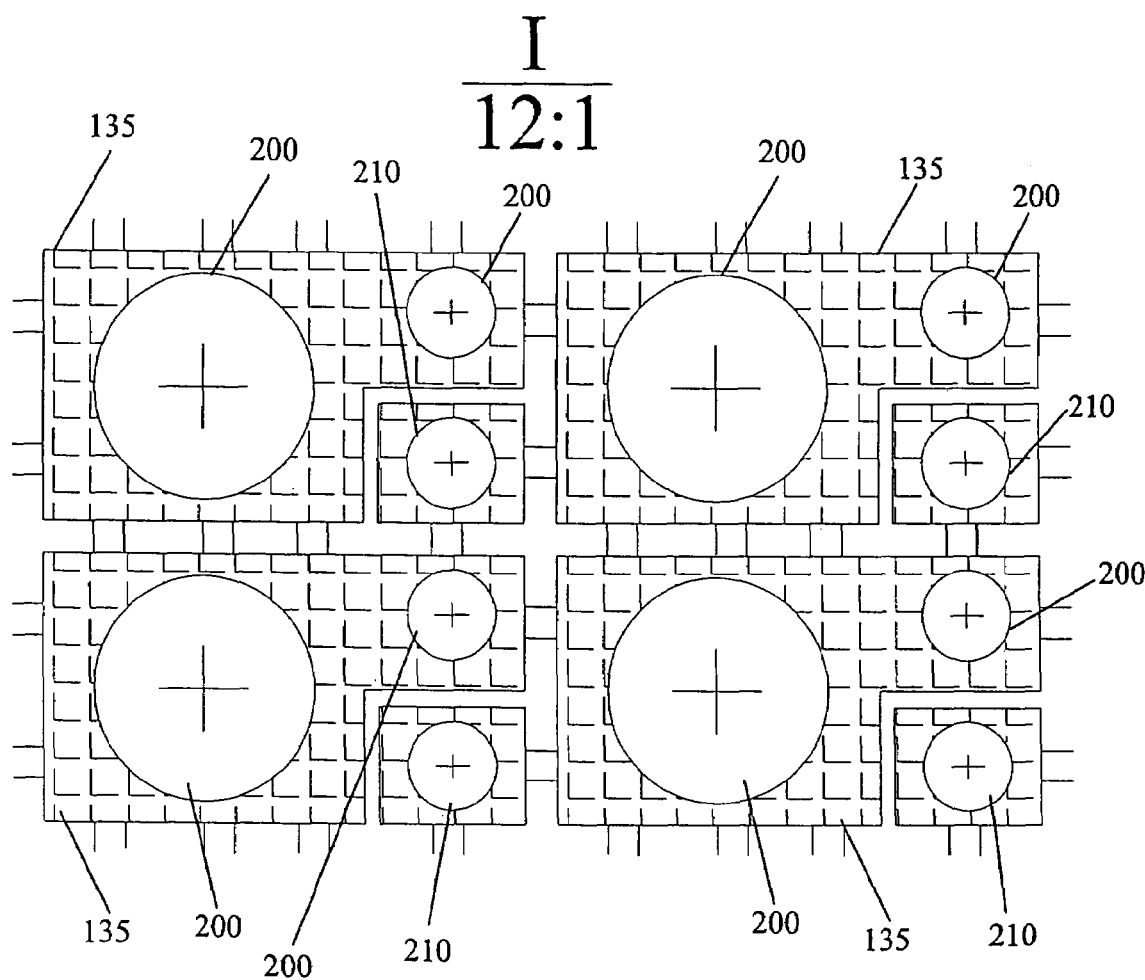
FIG. 2 is a top view of a die level dimpled lead frame in accordance with the invention.
Figure 3:
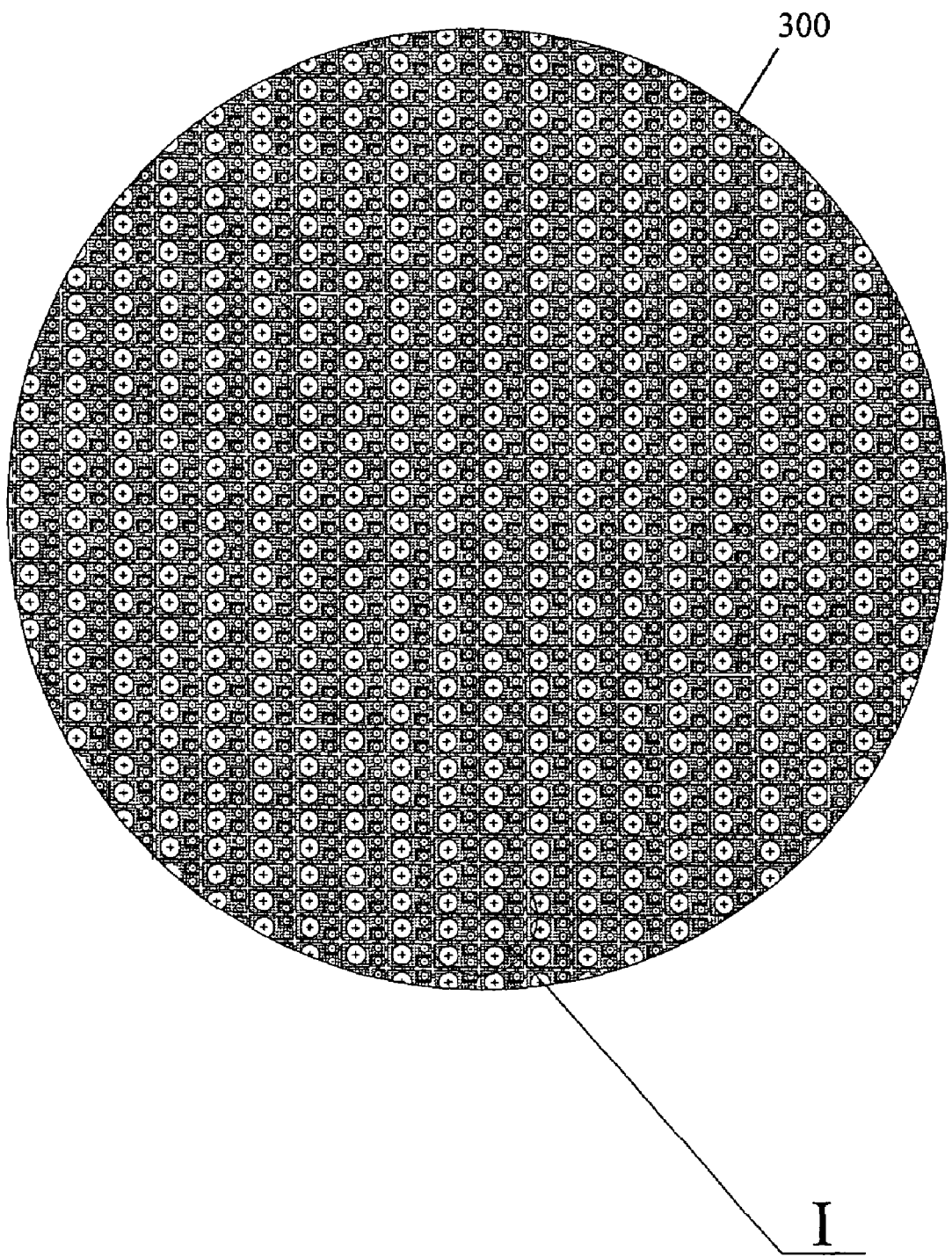
FIG. 3 is a top view of wafer level dimpled lead frame in accordance with the invention.

With reference to FIG. 2, a representative sample of lead frames 135 are shown including a printed pattern for preparing the lead frames 135 for dimpling. A plurality of source dimples 200 and gate dimples 210 are shown patterned on the lead frames 135. Source and gate dimples 200 and 210 may be stamped or punched in lead frames 135 in a conventional manner. A wafer level representation of a patterned wafer 300 is shown in FIG. 3.

Figure 4:
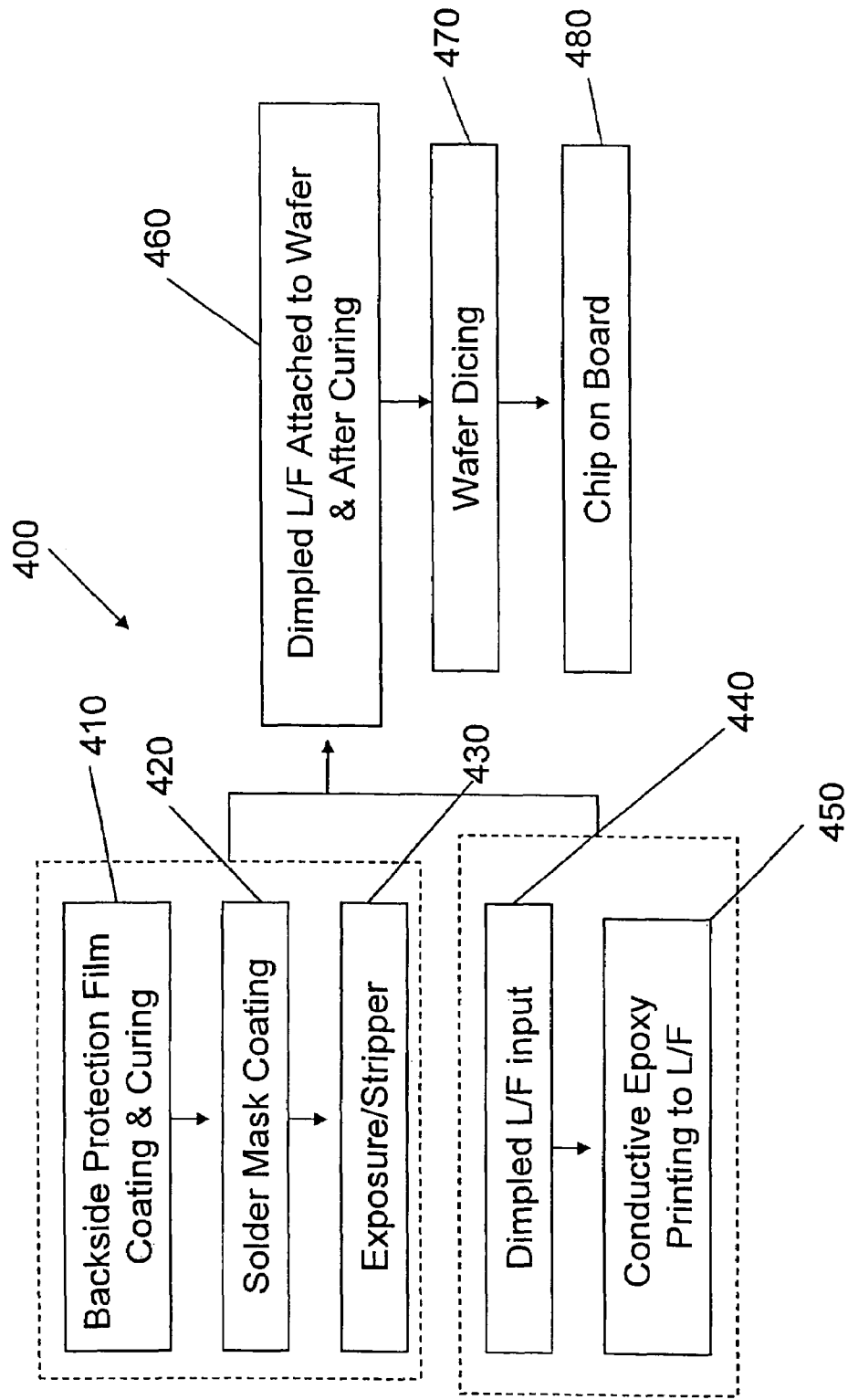
FIG. 4 is a flow chart illustrating the process steps of making a flip chip mounted semiconductor device in accordance with the invention.

A wafer level bumpless method of making a flip chip mounted semiconductor device generally designated 400 includes a step 410 in which the protective backside epoxy 115 may be coated and cured on semiconductor dies formed on a wafer (FIG. 4). In a step 420 the solder mask 120 may be coated and in a step 430 the solder mask 120 may be exposed and/or stripped to expose the gate and source contact pads.

Figure 5:
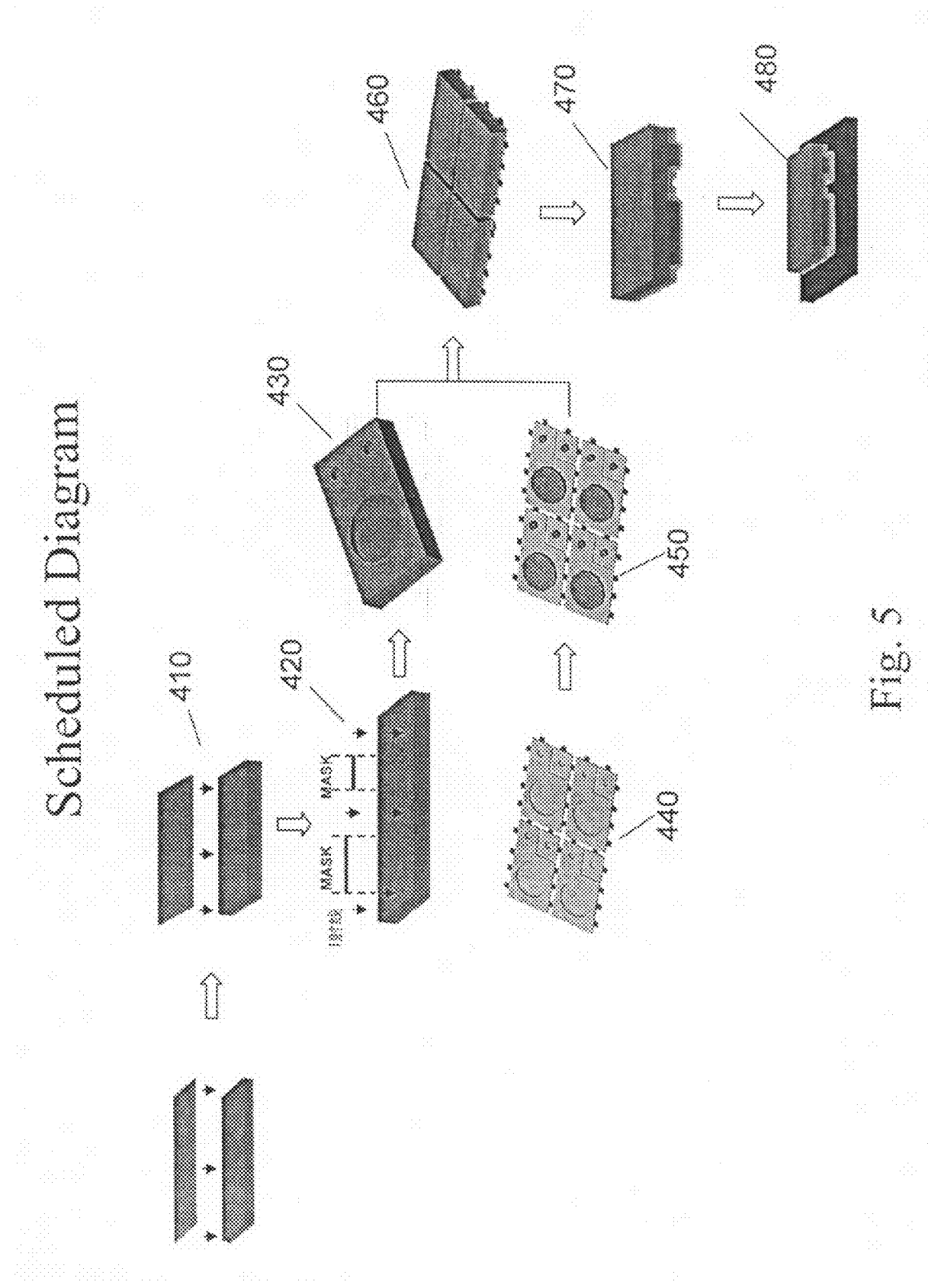
FIG. 5 is a schematic illustration of the process shown in FIG. 4.

Lead frames 135 may be patterned and dimpled in a step 440 and epoxy 140 may be printed on the lead frames 135 in a step 450. The lead frames 135 and the semiconductor dies 110 may be attached and cured in a step 460. Following curing, the wafer may be diced in a step 470 and the individual semiconductor device packages 100 mounted to a printed circuit board in a step 480. The method steps 410 through 480 are graphically represented in FIG. 5.

The wafer level bumpless method of making a flip chip mounted semiconductor device package of the invention eliminates the need for bumping the semiconductor dies and thereby reduces the cost of the flip chip semiconductor package. In contrast to traditional flip chip technology where the thermal expansion mismatch often causes mechanical failures in joint areas, the thermal expansion mismatch between the dimpled lead frame and the printed circuit board is reduced. Additionally, a larger joint area for board level mounting is provided which provides improved reliability and thermal and electrical performance.

The method of the invention further does not require under filling for board level chip scale packaging. Furthermore, there is no need for using external force or thermo sonic energy to connect bumps on the die active area and therefore the method of the invention results in increased yields due to reduced loss of parts. Finally, the method of the invention is simpler than conventional methods and will lead to acceptance by assembly houses lowering the cost of flip chip technology.

It should be understood, of course, that the foregoing relates to preferred embodiments of the invention and that modifications may be made without departing from the spirit and scope of the invention as set forth in the following claims.

We claim:

1. A flip chip mounted semiconductor device package comprising:
   a leadframe having a plurality of source dimples and a gate dimple;
   a semiconductor die having a plurality of source contact areas and a gate contact area corresponding to the leadframe source dimples and gate dimple respectively, the semiconductor die being flipped onto the leadframe such that cured conductive epoxy provides electrical and mechanical contact between the plurality of source contact areas and the plurality of source dimples, and the gate contact area and the gate dimple.

2. The semiconductor device package of claim 1, wherein the plurality of source contact areas and the gate contact area are formed by processing a solder mask on a die frontside.

3. The semiconductor device package of claim 1, wherein a device backside comprises a layer of cured protective epoxy.

4. The semiconductor device package of claim 1, wherein the plurality of source dimples and the gate dimple are formed by stamping the leadframe.

5. The semiconductor device package of claim 1, wherein the plurality of source dimples and the gate dimple are formed by punching the leadframe.

* * * * *